(12) United States Patent
Wu et al.

(10) Patent No.: US 11,266,008 B2
(45) Date of Patent: Mar. 1, 2022

(54) ELECTRICAL ASSEMBLY

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Heng-Kang Wu, Shenzhen (CN); Xiong Tan, Shenzhen (CN); Fu-Jin Peng, Shenzhen (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 119 days.

(21) Appl. No.: 16/601,585

(22) Filed: Oct. 15, 2019

(65) Prior Publication Data

US 2020/0120790 A1 Apr. 16, 2020

(30) Foreign Application Priority Data

Oct. 15, 2018 (CN) .......................... 201821670561.2

(51) Int. Cl.
*H05K 1/02* (2006.01)
*H05K 7/20* (2006.01)
*H01R 12/51* (2011.01)

(52) U.S. Cl.
CPC ........... *H05K 1/0209* (2013.01); *H01R 12/51* (2013.01); *H05K 7/20372* (2013.01); *H05K 2201/10409* (2013.01); *H05K 2201/10454* (2013.01)

(58) Field of Classification Search
CPC ..... H05K 7/20372; H05K 2201/10454; H05K 2201/10409; H05K 1/0203; H05K 1/0201; H05K 1/0204; H05K 1/0209; H05K 2201/064; H05K 2201/066; H05K 2201/10393; H05K 2201/2018;
(Continued)

(56) References Cited

U.S. PATENT DOCUMENTS 5,104,327 A * 4/1992 Walburn .............. H01R 43/007
439/492
7,285,851 B1 * 10/2007 Cepeda-Rizo ............ G06F 1/20
257/712
(Continued)

FOREIGN PATENT DOCUMENTS

CN 207459230 6/2018

OTHER PUBLICATIONS

English Translation CN207459230 (Year: 2017).*

*Primary Examiner* — Steven T Sawyer
(74) *Attorney, Agent, or Firm* — Ming Chieh Chang; Wei Te Chung (57) ABSTRACT

An electrical assembly includes an electrical connector mounted upon a PCB and receiving a CPU therein, and a liquid Nitrogen heat dissipation device is mounted upon the PCB and intimately seated upon the CPU to remove the heat therefrom. The liquid Nitrogen heat dissipation device includes a case forming a chamber to receive the liquid Nitrogen therein. A plurality of fixing arms extend outwardly and radially to fix the liquid Nitrogent heat dissipation device in position. A fixing seat is attached upon the PCB to precisely located the CPU in position with regard to the electrical connector.

17 Claims, 7 Drawing Sheets

(58) Field of Classification Search
CPC ............... H05K 7/20336; H01R 12/51; G06F 2200/201; G06F 1/20; H01L 23/40; H01L 23/32; H01L 23/445
USPC ................................................ 174/250–252
See application file for complete search history.

(56) References Cited

U.S. PATENT DOCUMENTS

| | | | | |
|---|---|---|---|---|
| 7,518,235 | B2* | 4/2009 | Coico | H01L 23/4006 257/719 |
| 7,957,148 | B1* | 6/2011 | Gallarelli | H01L 23/32 361/719 |
| 2007/0070603 | A1* | 3/2007 | Park | H01L 23/4006 361/695 |
| 2008/0163631 | A1* | 7/2008 | Campbell | H05K 7/20809 62/175 |
| 2009/0314473 | A1* | 12/2009 | Yoshikawa | H01L 23/473 165/104.31 |
| 2019/0115282 | A1* | 4/2019 | Wu | H01L 23/4006 |
| 2019/0221491 | A1* | 7/2019 | Wu | H01R 13/22 |

\* cited by examiner

ELECTRICAL ASSEMBLY

BACKGROUND OF THE INVENTION

1. Field of the Invention

The present invention relates generally to an electrical assembly, and particularly to the combination of a CPU (Central Processing Unit) loaded upon an electrical connector which is mounted upon a PCB (printed circuit board), and a liquid Nitrogen heat sink is mounted upon the PCB and intimately seated upon the CPU.

2. Description of Related Arts

China Utility Patent No. CN203786645 discloses a case for retaining a mother board therein, is built with a heat dissipation plate, on which the mother board is attached, having an interior cavity filled with the circulated liquid Nitrogen to remove the heat accumulated on the mother board. Anyhow, the CPU is the primary source of the heat on the mother board so the heat transfer via such a heat dissipation plate does not work well enough It is desired to have an electrical assembly having the corresponding heat dissipation device to efficiently remove heat generated from the CPU.

SUMMARY OF THE INVENTION

An electrical assembly includes an electrical connector mounted upon a PCB and receiving a CPU therein, and a liquid Nitrogen heat dissipation device is mounted upon the PCB and intimately seated upon the CPU to remove the heat therefrom. The liquid Nitrogen heat dissipation device includes a case forming a chamber to receive the liquid Nitrogen therein. A plurality of fixing arms extend outwardly and radially to fix the liquid Nitrogen heat dissipation device in position. A fixing seat is attached upon the PCB to precisely located the CPU in position with regard to the electrical connector

DETAILED DESCRIPTION OF THE PREFERRED EMBODIMENT

Figure 1:
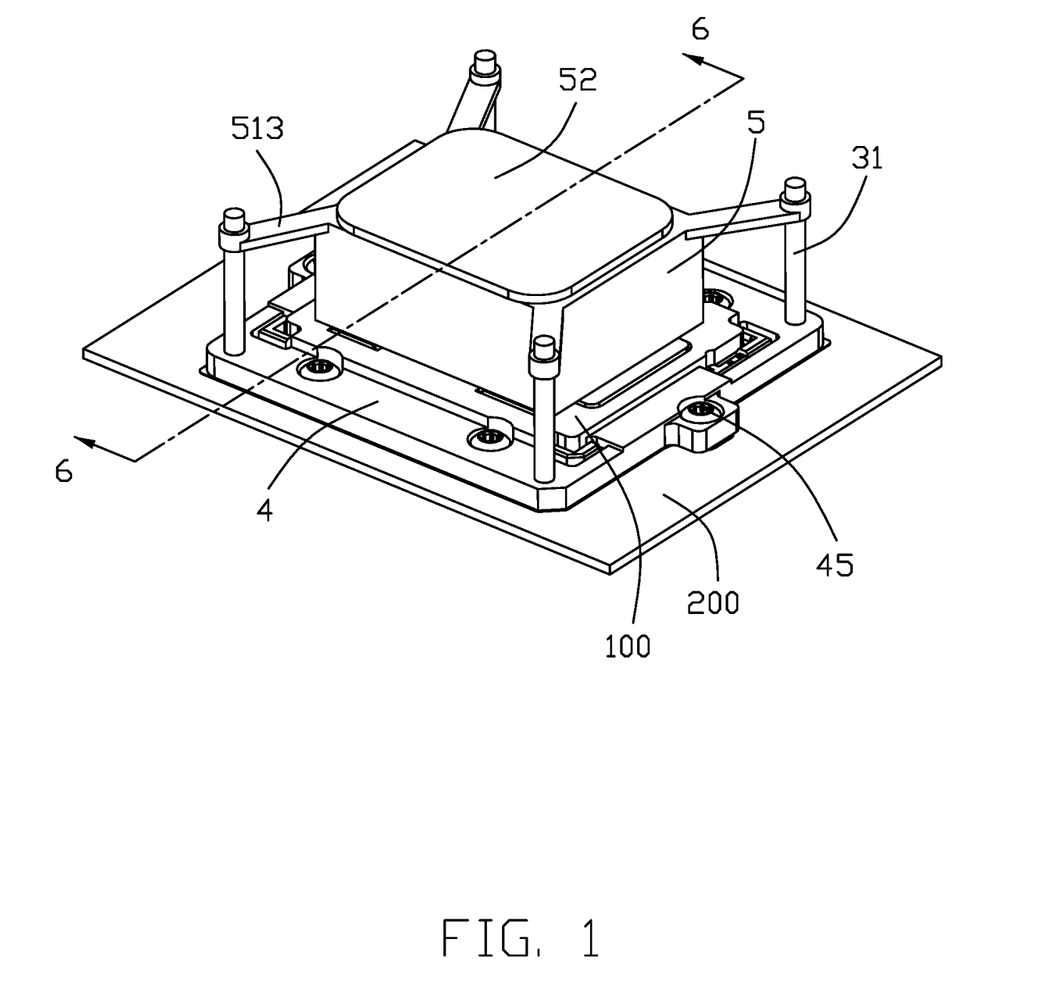
FIG. 1 is a perspective view of an electrical assembly including an electrical connector mounted upon the PCB and receiving a CPU therein with the liquid Nitrogen heat dissipation device seated upon the CPU and mounted to the PCB, according to the invention.
Figure 1A:
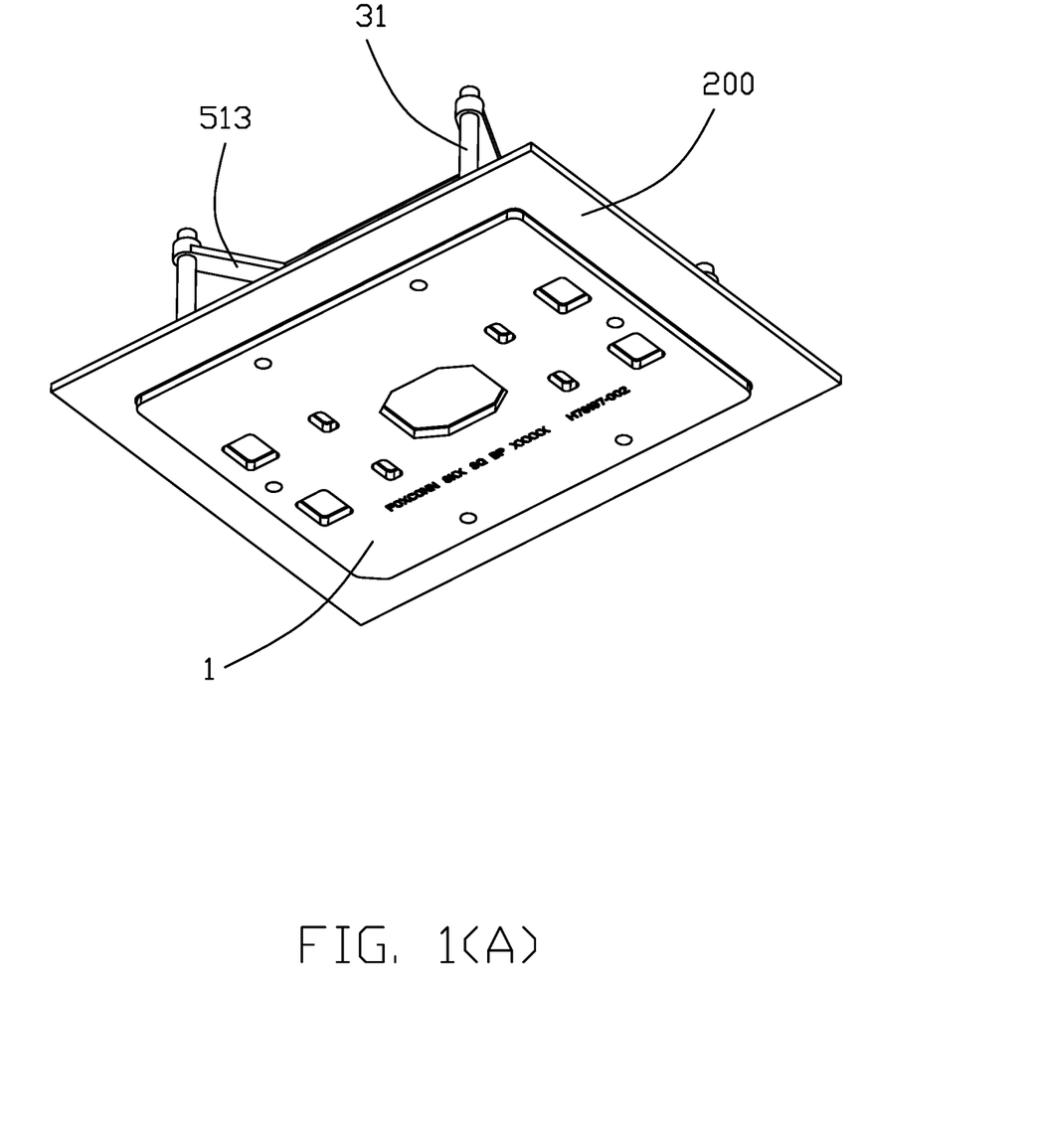
FIG. 1(A) is another perspective view of the electrical assembly of FIG. 1.
Figure 2:
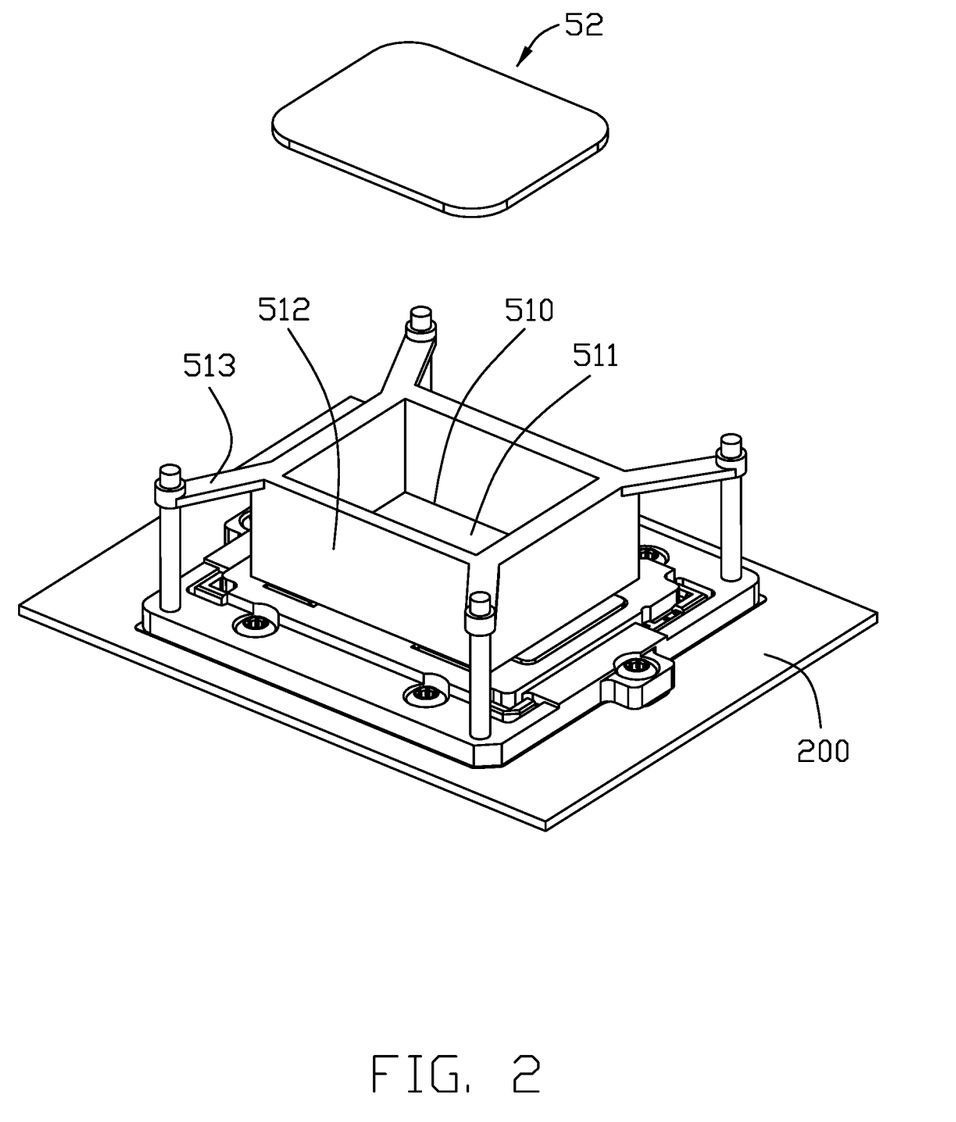
FIG. 2 is an exploded perspective view of the electrical assembly of FIG. 1.
Figure 3:
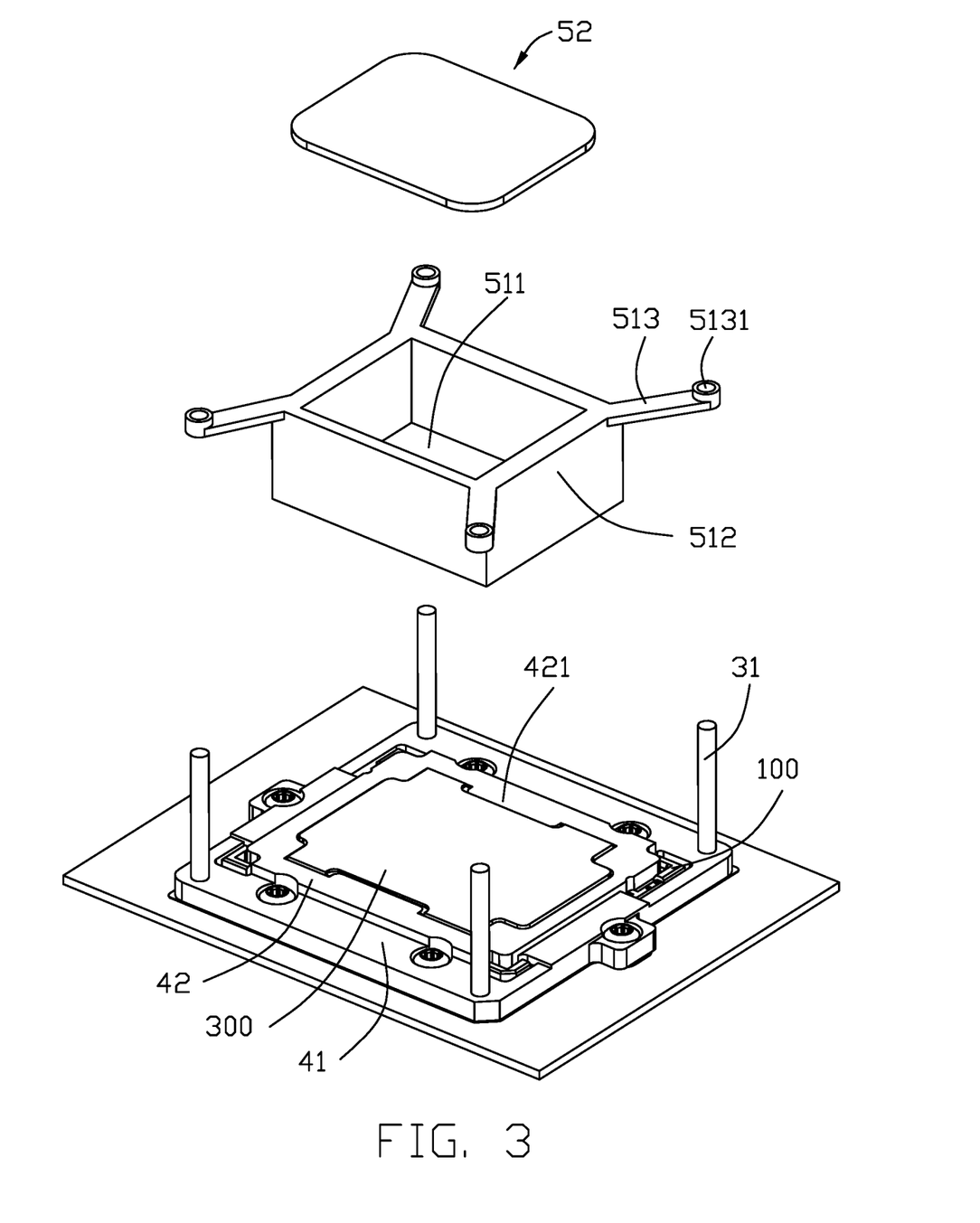
FIG. 3 is a further exploded perspective view of the electrical assembly of FIG. 2.
Figure 4:
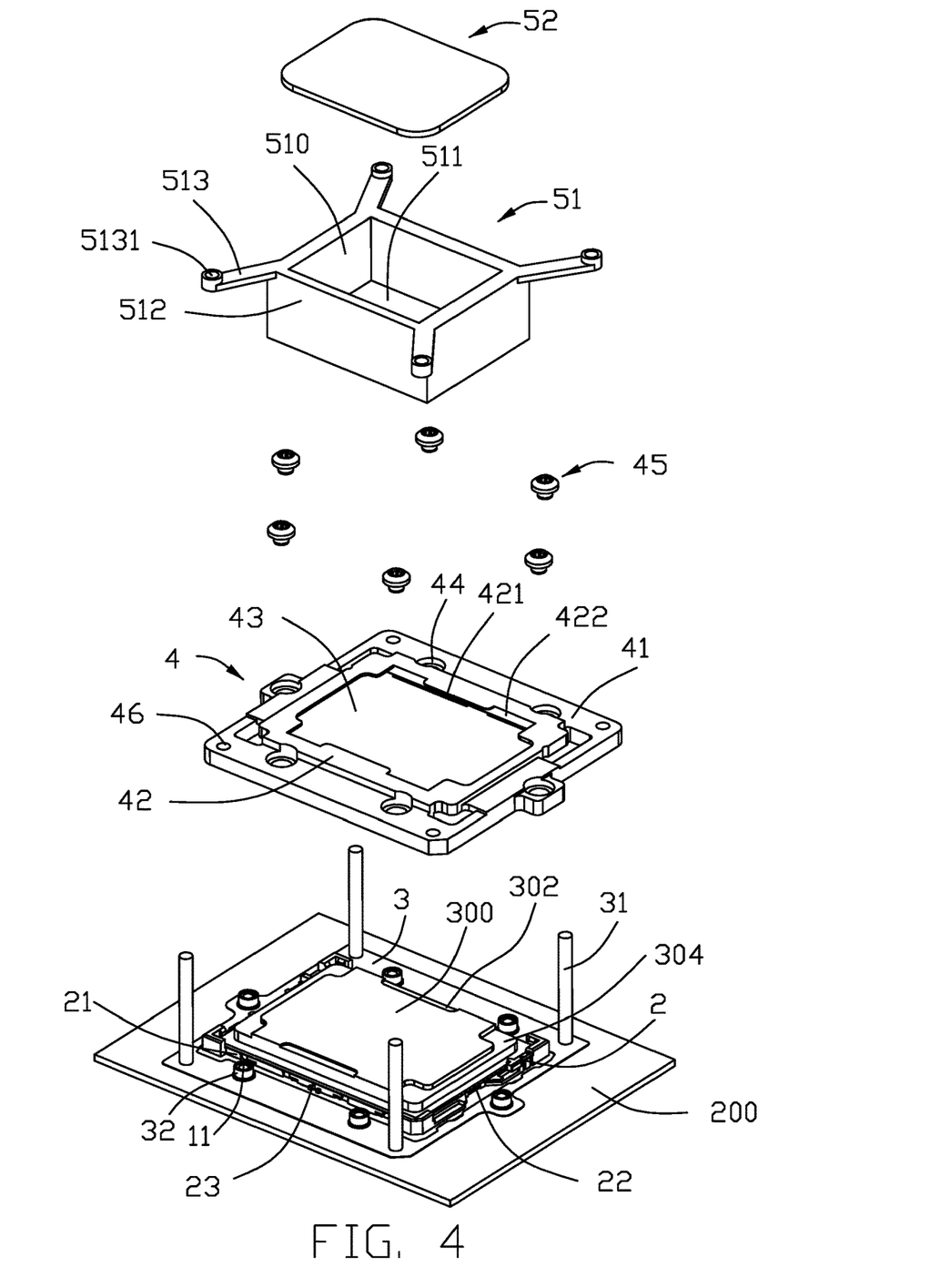
FIG. 4 a further exploded perspective view of the electrical assembly of FIG. 3.
Figure 5:
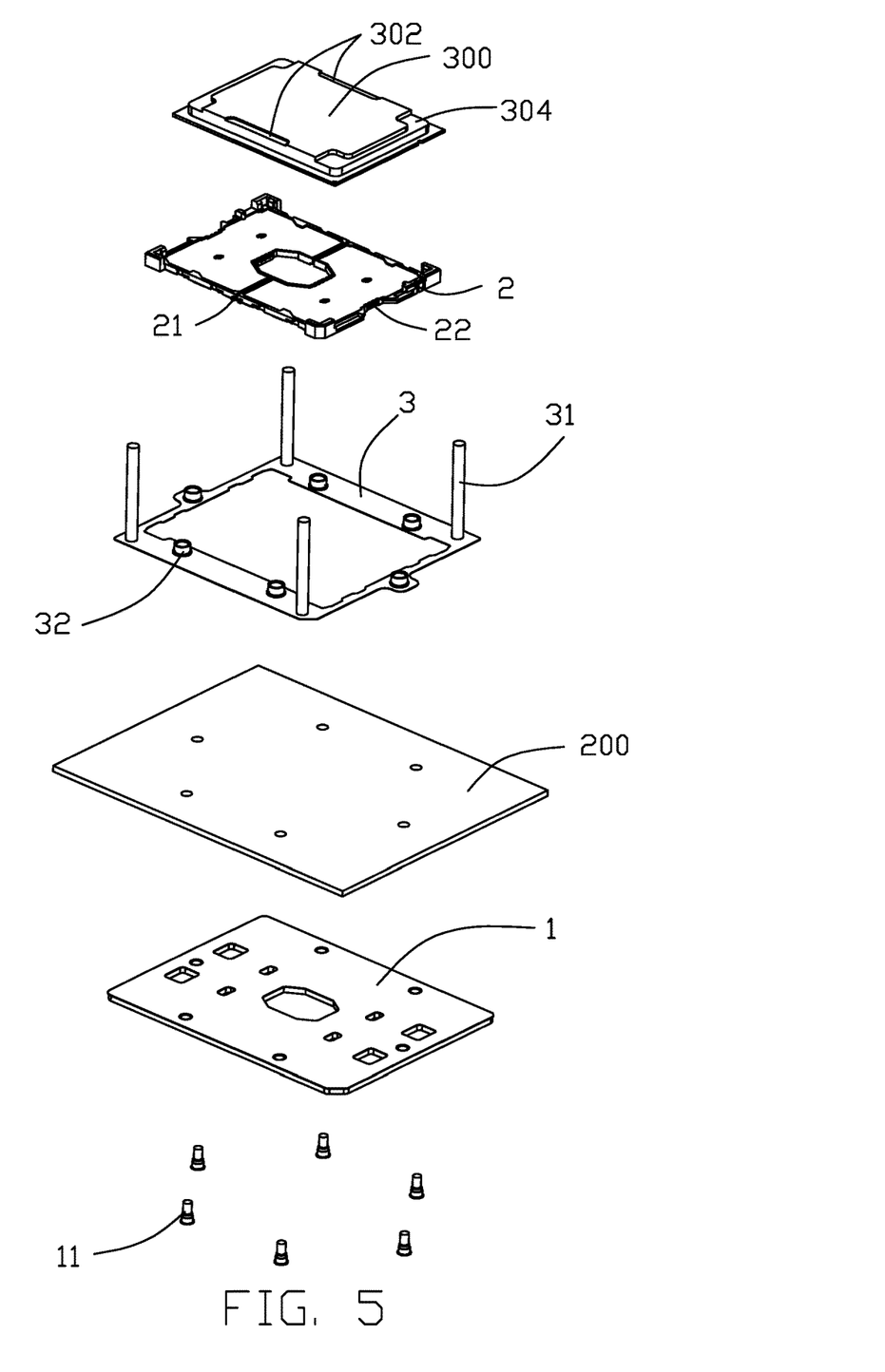
FIG. 5 is a further exploded perspective view of the electrical assembly of FIG. 4 without the fixing seat and the heat dissipation device.
Figure 6:
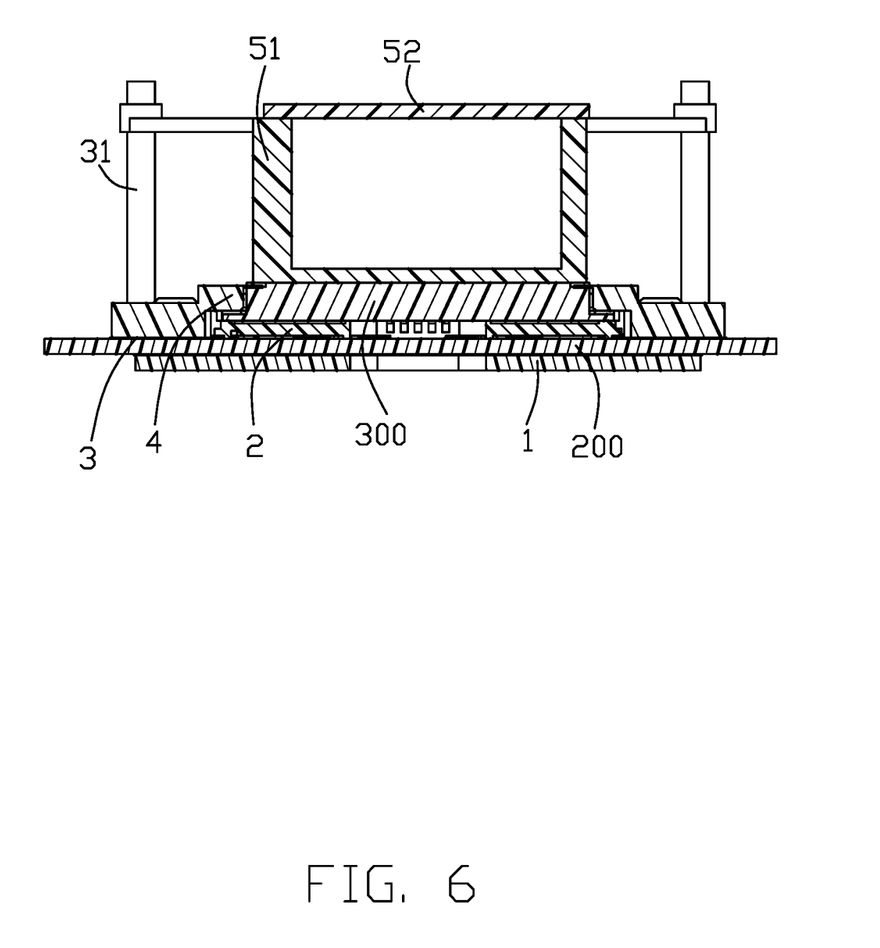
FIG. 6 is a cross-sectional view of the electrical assembly of FIG. 1.

Referring to FIGS. 1-6, an electrical assembly 100 including an electrical connector 2 mounted upon a PCB 200 and receiving a CPU or electronic package 300 therein for electrically connecting the CPU 300 to the PCB 200. A heat dissipation device 5 is essentially located upon the connector 2 and intimately contacts the CPU 300. The electrical assembly 100 includes a metallic back plate 1 seated upon an undersurface of the PCB 200. A frame like metallic positioning seat 3 is positioned upon a top surface of the PCB 200 to surround the electrical connector 2. A fixing seat 4 is assembled upon the positioning seat 3 to downwardly press the CPU 300 in position within the connector 2. Understandably, the contacts of the connector 2 which electrically connecting the CPU 300 to the PCB 200, are not shown.

The back plate 1 includes a plurality of screw posts 11 extending through the PCB 200 and the positioning seat 3 to fasten the fixing seat 4 via the nut 45. The electrical connector 2 includes a pair of long sides 23 and a pair of short sides 22.

The positioning seat 3 includes four upstanding alignment posts 31 at four corners, and a plurality of sleeves 32 through which the corresponding screw posts 11 respectively extend. The fixing seat 4 includes a frame like base 41 defining an opening 43, and a plurality of protrusions 42 inwardly and sidewardly extending toward a center of the opening 43 to downwardly confront the electrical connector 2 with corresponding pressing plates 421 to be received within the recess 302 of the CPU 300 for downwardly pressing the CPU 300 which is received within the electrical connector 2 and exposed within the opening 43. The other portions of the protrusions 42 are received within the recess 304 of the CPU 300 for downwardly pressing the CPU 300. The top face of the CPU 300 is slightly higher than the fixing seat 4 so as to assure reliable abutment between the top face of the CPU 300 and the bottom face of the heat dissipation device 5 for superior heat transfer. The fixing seat 4 includes a plurality of through holes 44 receiving the corresponding sleeves 32 so as to allow the screw posts 11 to extend upwardly therethrough for securing with the corresponding nuts 45. Via this arrangement, not only the fixing seat 4 is secured upon the PCB 200 but also the CPU 300 is reliably retained in the electrical connector 2. Notably, the fixing seat 4 forms a pair of spaces 422 by two sides of each pressing plate 421 to comply with the contour of the CPU 300.

The heat dissipation device 5 includes a case 51 shielded by a cover 52. The bottom of the case 51 is seated upon the CPU 300. The case 51 includes a bottom plate 511 and corresponding side walls 512 commonly forming the cavity 510 to receive the corresponding liquid Nitrogen therein. A plurality of fixing arms 513 extend outwardly and radially from four corners of the side walls 512 to be fasten, via the corresponding positioning holes 5131, to the corresponding alignment posts 31 of the positioning seat 3, respectively. The fixing seat 4 forms four through holes 46 in alignment with the corresponding positioning holes 5131, which the corresponding alignment posts 31 extend through. This alignment posts 31 may be unitarily formed with the positioning seat 3, or discrete therefrom while being threaded into the interior threads of the through holes 46. Understandably, the positioning seat 3 and the fixing seat 4 may be unified as one piece, if applicable.

In assembling, the electrical connector 2 is mounted/soldered upon the top surface of the PCB 200 with the CPU 300 received therein, the back plate 1 is positioned on an undersurface of the PCB 200, the positioning seat 3 is seated upon the top surface of the PCB 200 to surround the electrical connector 2, the fixing seat 4 is positioned upon the positioning seat 3 to surround both the electrical connector 2 and the CPU 300, wherein both the fixing seat 4 and the positioning seat 3 are fastened upon the PCB 200 via the nuts 45 locked upon the corresponding screw posts 11 of the back seat 1. As mentioned before, the CPU 300 is downwardly pressed by the protrusions 42 and the associated pressing plates 421. The heat dissipation device 5 is positioned upon the CPU 300 with the corresponding fixing arms 513 engaged to the corresponding alignment posts 31 via the corresponding positioning holes 5131. Understandably, the heat dissipation device 5 is secured by an external device (not shown) so as to be intimately positioned upon the CPU 300 to remove the heat therefrom. Understandably, an addition part may be added to the heat dissipation device 5 to form a heat circulation system for efficiently remove the heat from the CPU 300, compared with the traditional metallic heat sink.

What is claimed is:

1. An electrical assembly comprising:
   a printed circuit board defining an upper surface and a lower surface opposite to each other in a vertical direction;
   a back plate positioned under the lower surface;
   an electrical connector mounted upon the upper surface;
   an electronic package received within the connector;
   a fixing seat positioned on the upper surface to not only surround the electrical connector but also downwardly press the electronic package;
   a heat dissipation device having a case filled with liquid Nitrogen and downwardly pressing the electronic package; and
   a metallic positioning seat positioned between the fixing seat and the printed circuit board in the vertical direction; wherein
   a plurality of metallic alignment posts extend from the positioning seat, and the heat dissipation device includes a plurality of outwardly and radially extending fixing arms engaged with corresponding alignment posts, respectively.

2. The electrical assembly as claimed in claim 1, wherein the heat dissipation device downwardly presses a center region of the electronic package while the fixing seat downwardly presses a peripheral region of the electronic package.

3. The electrical assembly as claimed in claim 1, wherein the alignment posts upwardly extend away from the printed circuit board in a stationary manner.

4. The electrical assembly as claimed in claim 3, wherein said fixing arms extend from an upper region of the heat dissipation device and are spaced from the printed circuit board with a distance roughly equal to a sum of a height of the case, that of the electronic package and that of the electrical connector.

5. The electrical assembly as claimed in claim 3, wherein the alignments posts extend through corresponding through holes in the fixing seat.

6. The electrical assembly as claimed in claim 1, wherein the fixing seat is secured to the back plate with the printed circuit board sandwiched therebetween in the vertical direction.

7. The electrical assembly as claimed in claim 6, wherein the back plate includes a plurality of screw posts, and the fixing seat includes a plurality of nuts secured thereto so as to secure the fixing seat to the back plate with the printed circuit board therebetween.

8. The electrical assembly as claimed in claim 1, wherein said fixing arms extend from an upper region of the heat dissipation device and are spaced from the printed circuit board with a distance roughly equal to a sum of a height of the case, that of the electronic package and that of the electrical connector.

9. The electrical assembly as claimed in claim 1, wherein the fixing arms extend toward four corners of the fixing seat.

10. The electrical assembly as claimed in claim 1, wherein the positioning seat is of a frame like configuration.

11. The electrical assembly as claimed in claim 1, wherein the fixing seat is of a frame like configuration.

12. An electrical assembly comprising:
    a printed circuit board defining an upper surface in a vertical direction;
    a metallic positioning seat directly positioned upon the upper surface;
    an insulative fixing seat positioned upon the positioning seat;
    an electrical connector mounted upon upper surface and surrounded by both the positioning seat and the fixing seat;
    an electronic package received within the electrical connector; and
    a heat dissipation device intimately positioned upon the electronic package;
    wherein
    the heat dissipation device downwardly presses a center region of the electronic package while the fixing seat downwardly presses a peripheral region of the electronic package; and
    the positioning seat is provided with a plurality of sleeves, and the fixing seat is provided with corresponding through holes receiving said sleeves, respectively.

13. The electrical assembly as claimed in claim 12, wherein the heat dissipation device further includes a plurality of outwardly and radially extending fixing arms engaged with corresponding alignment posts extending upwardly from the positioning seat.

14. The electrical assembly as claimed in claim 13, wherein the alignment posts extend through corresponding through holes in the fixing seat.

15. The electrical assembly as claimed in claim 12, further comprising a back plate positioned upon a lower surface of the printed circuit board, and wherein a plurality of nuts extend downwardly through corresponding through holes, respectively, and a plurality of screw posts extend upwardly through corresponding sleeves, respectively, to engage the nuts.

16. An electrical assembly comprising:
    a back plate positioned at a lower surface of a printed circuit board;
    a metallic positioning seat positioned at an upper surface of the printed circuit;
    an insulative fixing seat positioned upon the positioning seat;
    an electrical connector mounted upon the upper surface of the printed circuit board and surrounded by both the positioning seat and the fixing seat;
    an electronic package placed within the electrical connector; and
    a heat dissipation device intimately positioned upon the electronic package; wherein
    the heat dissipation device downwardly presses a center region of the electronic package while the fixing seat downwardly presses a peripheral region of the electronic package;
    the positioning seat includes a plurality of alignment posts, and the heat dissipation device includes a plurality of outwardly and radially extending fixing arms engaged with corresponding alignment posts, respectively; and the alignment posts extend through corresponding through holes in the fixing seat.

17. An electrical assembly comprising:

a back plate positioned at a lower surface of a printed circuit board;

a metallic positioning seat positioned at an upper surface of the printed circuit;

an insulative fixing seat positioned upon the positioning seat;

an electrical connector mounted upon the upper surface of the printed circuit board and surrounded by both the positioning seat and the fixing seat;

an electronic package placed within the electrical connector; and a heat dissipation device intimately positioned upon the electronic package; wherein the heat dissipation device downwardly presses a center region of the electronic package while the fixing seat downwardly presses a peripheral region of the electronic package;

the positioning seat includes a plurality of alignment posts, and the heat dissipation device includes a plurality of outwardly and radially extending fixing arms engaged with corresponding alignment posts, respectively; and the positioning seat is provided with a plurality of sleeves, and the fixing seat is provided with corresponding through holes receiving the sleeves, respectively.

* * * * *